(12) United States Patent
Ando

(10) Patent No.: US 6,266,746 B1
(45) Date of Patent: Jul. 24, 2001

(54) CONTROL APPARATUS FOR RANDOM ACCESS MEMORIES

(75) Inventor: Tomoaki Ando, Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 09/120,277

(22) Filed: Jul. 22, 1998

(30) Foreign Application Priority Data

Jul. 29, 1997 (JP) .................................................. 9-203579
Aug. 6, 1997 (JP) .................................................. 9-212199

(51) Int. Cl.[7] .............................. G06F 12/00; G11C 7/00; G11C 16/04
(52) U.S. Cl. .......................... 711/154; 711/104; 711/170; 365/189.01; 326/40; 326/41
(58) Field of Search ..................................... 711/104, 170, 711/154; 326/40, 41; 365/189.01, 189.04, 194

(56) References Cited

U.S. PATENT DOCUMENTS

| | | | |
|---|---|---|---|
| 4,616,338 | * | 10/1986 | Helen et al. ........................... 364/900 |
| 4,815,039 | * | 3/1989 | Tai et al. ............................... 365/189 |
| 4,882,710 | * | 11/1989 | Hashimoto et al. ............. 365/189.05 |
| 4,933,901 | * | 6/1990 | Tai et al. ........................... 365/189.07 |
| 5,572,148 | * | 11/1996 | Lytle ....................................... 326/41 |
| 5,977,791 | * | 11/1999 | Veenstra ................................. 326/40 |

* cited by examiner

Primary Examiner—Do Hyun Yoo
Assistant Examiner—Kimberly McLean
(74) Attorney, Agent, or Firm—Reed Smith Hazel & Thomas LLP

(57) ABSTRACT

A control apparatus controls writing and reading of data with respect to a memory which is randomly accessible. An address producing device produces an address by a method according to a predetermined rule, in response to a request to access the memory by the method according to the predetermined rule. A switching device selects one of an address with which the memory is randomly accessed and the address produced by the address producing device. Data is written into and read from the memory, at a location that corresponds to the address that is selected by the switching device and supplied to the memory. It is advantageous to provide a control device which supplies a switching signal to the switching device to cause the switching device to select one of the address with which the memory is randomly accessed and the address produced by the address producing device, depending upon the presence of a request to access the memory by the method according to the predetermined rule and the presence of a request to randomly access the memory.

4 Claims, 10 Drawing Sheets

EFFECT (FOR EXAMPLE, REVERD, ECHO) GIVEN BY DSP HIGH-SPEED PROCESSING

PROCESSING OUTPUT AT SAMPLING FREQUENCY (FOR EXAMPLE, 48KHz)

CONTROL APPARATUS FOR RANDOM ACCESS MEMORIES

BACKGROUND OF THE INVENTION

1. Field of the Invention

The present invention relates to a control apparatus for RAM (Random Access Memory), which controls writing and reading of data with respect to RAM.

2. Prior Art

A known sound signal processing apparatus for processing a sound signal is constructed as shown in FIG. 1, by way of example, In this example, the former stage portion outputs a sound signal that has been delayed by a certain time in a RAM (random access memory), to a First-in First-out memory (hereinafter called "FIFO") in the later stage, and also adds the above sound signal after multiplying it by a certain coefficient, to a newly received sound signal, so that the result of addition is re-stored in the same area or location of the RAM. In this matter, a so-called accumulator function is performed in which effects, such as reverb and echo, are given to the sound signal. In the present specification, the accumulator function means the function to perform a certain operation(s) on data that are read from a given area of the RAM, and re-store the processed data in the same area of the RAM. The later stage portion, on the other hand, performs a FIFO function to output the sound signal to which effects as indicated above have been given in the former stage, at a given rate (sampling frequency) of, for example, 48 kHz. This FIFO function is accomplished by controlling a manner in which data is written into and read from the RAM. In the arrangement in which the FIFO provided in the later stage converts the sound signal at the given rate and outputs the converted signal, DSP, CPU or the like, which operates at an asynchronous, high-speed operating frequency. Such a frequency is not limited to 48 kHz and can be used in the former stage portion.

As in a circuit arrangement shown in FIG. 2, the FIFO (pushup storage) is constructed by using a single-port RAM which has a simple structure and is available at a relatively low cost. In FIG. 2, a PUSH (write) counter 1 is adapted to update a write address by counting a clock pulse each time a PUSH signal is supplied, and supplies the write address to one of the input terminals of a selecting circuit 3. A POP (read) counter 2 is adapted to update a read address by counting a clock pulse each time a POP signal is supplied, and supplies the read address to the other input terminal of the selecting circuit 3. The POP counter 2 also receives the PUSH signal, and is inhibited from operating even if the POP signal is sup-lied thereto while the PUSH signal is effective. The selecting circuit 3 selects one of the write address and the read address according to the PUSH signal. Namely, the selecting circuit 3 supplies the write address to an address input terminal A of the single-port RAM 4 when the PUSH signal is supplied, and supplies the read address to the address input terminal A of the RAM 4 when the PUSH signal is not supplied. The single-port RAM 4 is normally placed in a READ mode, and is turned into a WRITE mode of the PUSH signal is supplied to a write enable terminal WE. The RAM 4 receives data via an input terminal DI, and outputs data through an output terminal DO.

In the above arrangement, if a PUSH signal is supplied, the PUSH (write) counter 1 updates the write address, and supplies the updated address to one of the input terminals of the selecting circuit 3. At this time, the PUSH signal supplied to the selecting circuit 3 functions as a select signal, and therefore the selecting circuit 3 supplies the write address to the address input terminal A of the single-port RAM 4. In the single-port RAM 4, data received through the input terminal DI is written into and stored at the write address as indicated above.

On the other hand, when a POP signal is supplied, the POP (read) counter 2 updates the read address, and supplies the updated address to the other input terminal of the selecting circuit 3. When a PUSH signal is not supplied, the selecting circuit 3 supplies the read address to the address input terminal A of the single-port RAM 4. In the single-port RAM 4, data stored at the read address is generated from the output terminal DO.

The POP counter 2 also receives the PUSH signal, and is inhibited from operating even if the POP signal is supplied thereto while the PUSH signal and the POP signal are simultaneously generated, priority is always given to the PUSH signal, and the POP signal is ignored.

In the known FIFO constructed as described above, when the PUSH signal and POP signal are simultaneously generated, priority must be given to either one of these signals. However, there is a sufficiently high possibility of such simultaneous generation of two types of signals, and, in such a case, the count value of the POP counter 2 is not updated if the POP signal is to be ignored, for example, and the same data is undesirably read from the memory twice.

SUMMARY OF THE INVENTION

It is therefore a first object of the invention to provide a control apparatus for RAM, wherein the RAM is controlled so as to serve as both an accumulator and a FIFO, thus permitting the whole circuit to have a reduced size.

It is a second object of the invention to provide a control apparatus for RAM, wherein priority can be automatically given to one of a write signal and a read signal for writing and reading data with respect to a single-port RAM even when these write and read signals are simultaneously generated, so that both writing and reading operations can be executed.

To attain the first object, according to a first aspect of the invention, there is provided a control apparatus for controlling writing and reading of data with respect to a memory which is randomly accessible, comprising an address producing device which produces an address by a method according to a predetermined rule, in response to a request to access the memory by the method according to the predetermined rule, and a switching device which selects one of an address with which the memory is randomly accessed and the address produced by the address producing device, wherein data is written into and read from the memory, at a location that corresponds to the address that is selected by the switching device and supplied to the memory.

Preferably, the control apparatus further comprises a control device which supplies a switching signal to the switching device to cause the switching device to select one of the address with which the memory is randomly accessed and the address produced by the address producing device, depending upon presence of a request to access the memory by the method according to the predetermined rule and presence of a request to randomly access the memory.

Preferably, the predetermined rule is a first-in first-out method.

In a preferred form of the first aspect, the control apparatus comprises a write address producing device which produces a write address by a method according to a predetermined rule, in response to a write request to write data into the memory by the method according to the predetermined rule, and a write address switching device which selects one of a write address with which data is randomly written into the memory and the write address produced by the write address producing device. A read address producing device which produces a read address by the method according to the predetermined rule, in response to a read request to read data from the memory by the method according to the predetermined rule, and a read address switching device which selects one of a read address with which data is randomly read from the memory and the read address produced by the read address producing device, wherein data is written into the memory at a location that corresponds to the write address selected by the write address switching device and supplied to the memory, and data is read from the memory at a location that corresponds to the read address selected by the read address switching device and supplied to the memory.

Preferably, the control apparatus of the preferred form further comprises a write control device which supplies a first switching signal to the write address switching device, to cause the write address switching device to select one of the write address with which data is randomly written into the memory and the write address produced by the write address producing device, depending upon presence of a request to write data into the memory by the method according to the predetermined rule, and presence of a request to randomly write data into the memory, and a read control device which supplies a second switching signal to the read address switching device, to cause the read address switching device to select one of the read address with which data is randomly read from the memory and the read address produced by the read address producing device, depending upon presence of a request to read data from the memory by the method according to the predetermined rule, and presence of a request to randomly read data from the memory.

In another preferred form of the first aspect, the control apparatus comprises a write address producing device which produces a write address by a method according to a predetermined rule, in response to a write request to write data into the memory, a read address producing device which produces a read address by the method according to the predetermined rule, in response to a read request to read data from the memory, a write address switching device which selects one of the write address produced by the write address producing device, and the read address produced by the read address producing device, according to a given switching signal, and a computing device which adds data generated from the memory to data input to the control apparatus, wherein when the write request is generated, the write address producing device produces the write address in response to the write request, and data is read from an address location of the memory that corresponds to the write address, while the computing device adds the data read from the memory to the data input the control apparatus, and then writes data obtained as a result of addition by the computing device into an address location of the memory that corresponds to the write address.

In the control apparatus according to the first aspect of the invention, where the memory (RAM) is used as a FIFO for example, the address producing device produces an address for FIFO, and the address is supplied to the memory via the switching device, so that a PUSH or POP action is performed on the memory. Where the memory is used as an accumulator, an address with which the memory is randomly accessed is supplied to the memory via the switching device, and data located at the address is read from the memory, subjected to calculations outside the memory, and then re-written into the same address of the memory. Thus, only one RAM is used to fulfill the functions of the accumulator and FIFO, and the size of the circuit can be thus reduced.

To attain the second object, according to a second aspect of the invention, there is provided a control apparatus for a single-port RAM, comprising an address producing device which produces a write address in response to a write signal for writing data into the RAM, and produces a read address in response to a read signal for reading data from the RAM, a detecting device which detects simultaneous generation of the write signal and the read signal, and an issuing device that supplies a selected one of the write signal and the read signal to which priority is given, to the address producing device, and then supplies the other of the write signal and the read signal to the address producing device, when the simultaneous generation of the write signal and the read signal is detected by the detecting device.

Normally, the issuing device issues the write signal as the selected one of the write signal and the read signal to which priority is given.

Preferably, the control apparatus further comprises a monitoring device which monitors a data storage state of the RAM, wherein the issuing device determines which of the write signal and the read signal is to be supplied to the address producing device, depending upon the data storage state detected by the monitoring device.

More preferably, the issuing device includes a device which makes the write signal ineffective and the read signal effective when the data storage state of the RAM detected by the monitoring device indicates that the RAM is substantially full of data, and a device which makes the write signal effective and the read signal ineffective when the data storage state of the RAM detected by the monitoring device indicates that the RAM is substantially empty.

In the control apparatus according to the second aspect of the invention, if simultaneous generation of the write signal and the read signal is detected by the detecting device, first, one of the write signal and read signal to which priority is given is supplied to the address producing device for generation of a write or read address, and then the other of the write signal and read signal is supplied to the address producing device for generation of a write or read address. In the case where the write signal (PUSH signal) is regarded as prioritized signal, and the read signal (POP signal) is regarded as non-prioritized signal, priority can be automatically given to the write signal when the write signal and read signal are generated at the same time, so that both of write and read commands or requests can be executed.

The above and other objects, features, and advantages of the invention will become more apparent from the following detailed description taken in conjunction with the accompanying drawings.

DETAILED DESCRIPTION

The invention will now be described in detail with reference to the drawings showing embodiments thereof.

Figure 3:
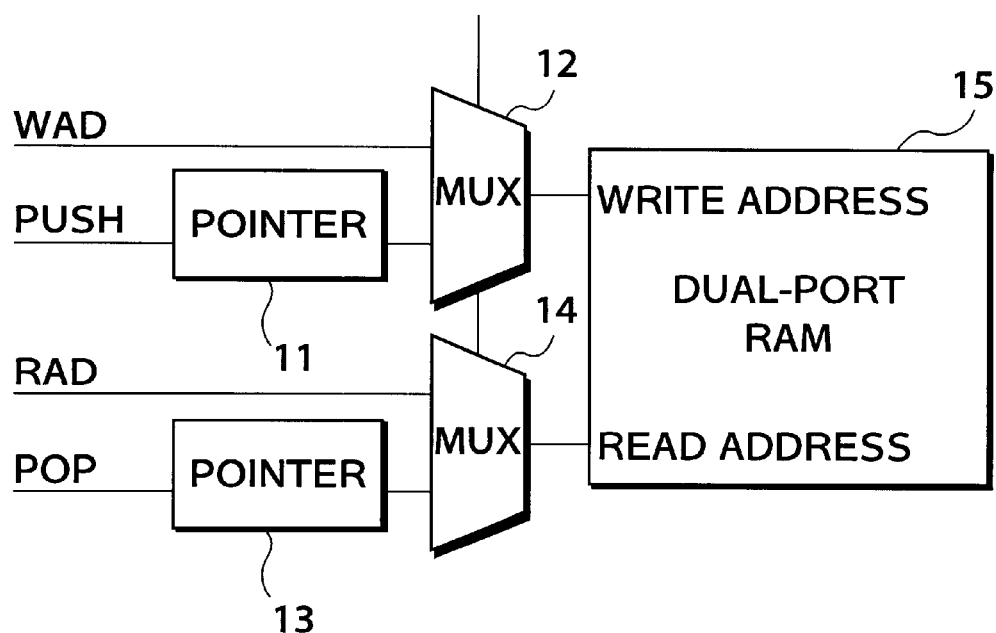
FIG. 3 is a block diagram showing the basic construction of a first embodiment of the present invention.

FIG. 3 shows the basic construction of the first embodiment of the invention. In FIG. 3, a pointer 11 is formed of a counter, and serves to update a count value indicative of a PUSH address (WRITE address) upon receipt or input of a PUSH signal, and supplies the count value to a selecting circuit 12. The selecting circuit 12 supplies the WRITE address WAD to a dual-port RAM 15 (described later) when the RAM 15 is used as an accumulator, and supplies the count value of the pointer 11 to the dual-port RAM 15 when the RAM 15 is used as a FIFO.

A pointer 13 is formed of a counter, and serves to update a count value indicative of a POP address (READ address) upon receipt or input of a POP signal, and supplies the count value to a selecting circuit 14. The selecting circuit 14 supplies the READ address RAD to the dual-port RAM 15 when the RAM 15 is used as an accumulator, and supplies the count value of the pointer 13 to the RAM 15 when the RAM 15 is used as a FIFO. The dual-port RAM 15 stores input data in an address location that corresponds to the WRITE address supplied from the selecting circuit 12, and outputs or generates stored data from an address location that corresponds to the READ address supplied from the selecting circuit 14. It is to be understood that the RAM does not necessarily take the form of a dual-port RAM.

In the arrangement as described above, where the dual-port RAM 15 is used as an accumulator, the WRITE address or READ address is directly supplied without passing through the pointers 11, 13, and the selecting circuits 12, 14 selects the WRITE address or READ address. In this case, the dual-[port RAM 15 stores supplied data in an address location corresponding to the WRITE address, or reads stored data from an address location corresponding to the READ address. Where the dual-[port RAM 15 is used as a FIFO, on the outer than, a PUSH signal or a POP signal is supplied to the pointer 11 or pointer 13 where a WRITE address or a READ address is produced, and the selecting circuits 12, 14 selects the WRITE address or READ address produced by the pointer 11 or pointer 13. In this case, the dual-port RAM 15 stores supplied data in an address location corresponding to the WRITE address, or reads data from an address location corresponding to the READ address.

Figure 4:
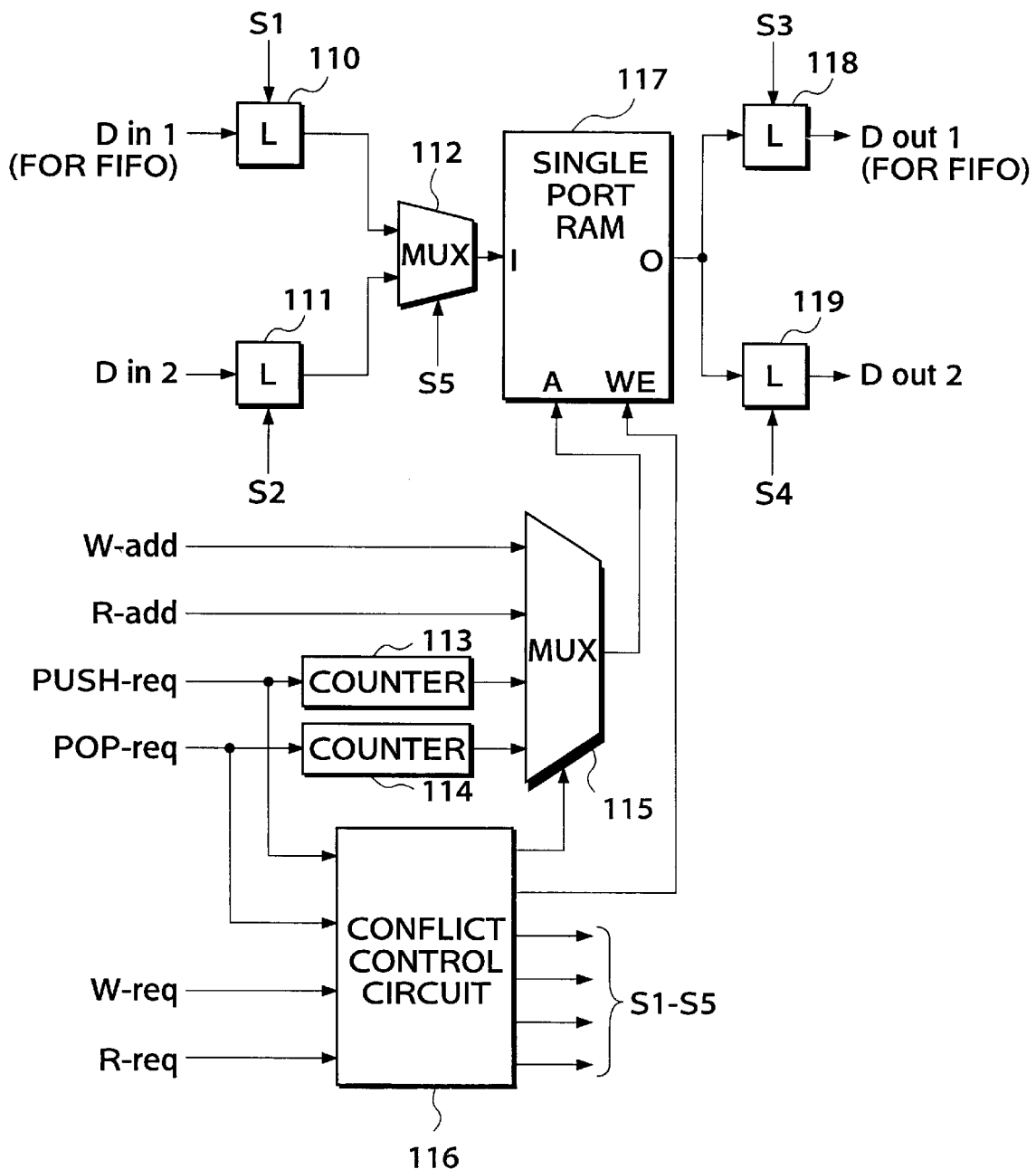
FIG. 4 is a block diagram showing the construction of a second embodiment of the invention.

FIG. 4 shows a second embodiment of the invention. In the second embodiment, a single-port RAM performs the FIFO processing and the accumulator processing (or random access processing), and a control system for the RAM is constructed so that a conflict between a PUSH request and a POP request and a conflict between a WRITE request and a READ request can be suitably controlled. In FIG. 4, a latch circuit 110 holds data Din1 supplied thereto when a single-port RAM 117 is used as a FIFO, according to a control signal S1 from a conflict control circuit 116, and supplies the data Din1 to one of input terminals of a selecting circuit 112.

A latch circuit 111 holds data Din2 supplied thereto when the single-port RAM 117 is used as an accumulator, according to a control signal S2 from the conflict control circuit 116, and supplies the data Din2 to the other input terminal of the selecting circuit 112. The selecting circuit 112 then supplies one of the data Din1 and data Din2 to a data input terminal I of the signal-port RAM 117, according to a control signal S5 from the conflict control circuit 16.

When a PUSH request signal PUSH-req is supplied, a counter 113 updates a count value indicative of a PUSH address, and supplies the count value to a selecting circuit 115. When a POP request signal POP-req is supplied, a counter 114 updates a count value indicative of a POP address, and supplies the count value to the selecting circuit 115. The selecting circuit 115 selects one of a WRITE address W-add and a READ address R-add with which the RAM 117 is randomly accessed, and the count value resulting from the PUSH request signal PUSH-req and the count value resulting from the POP request signal POP-req, according to a control signal from the conflict control circuit 116, and supplies the selected one to the address input terminal A of the RAM 117.

The conflict control circuit 116 produces control signals (select signal, latch timing signal, write enable signal, and so forth) to be supplied to the latch circuits 110, 111, selecting circuits 112, 115, RAM 117, and latch circuits 118, 119 which will be described later, upon receipt or supply of a WRITE request signal W-req and a READ request signal R-req with which the RAM 117 is randomly accessed, and the above-indicated PUSH request signal PUSH-req and POP request signal POP-req, and supplies the control signals thus produced to respective portions of the system.

The single-port RAM 117 stores data supplied to the data input terminal I in an address location corresponding to the address supplied to the address input terminal A while a write enable terminal WE of the RAM 117 is in an active state due to supply of the write enable signal thereto. When the write enable terminal WE is in a non-active state, on the other hand, data stored in an address location corresponding to the address supplied to the address input terminal A is read out and generated from an output terminal O of the RAM 117, to be supplied to the latch circuits 118, 119.

The latch circuits 118, 119 hold data generated from the RAM 117, according to respective control signals S3, S4 supplied from the conflict control circuit 116, and generate the data as data Dout1, Dout2, respectively, in certain timing. The latch circuit 118 serves to hold data when the RAM 117 is used as a FIFO, and the data generated from the latch circuit 118 is supplied to a D/A converter (not illustrated), or the like. On the other hand, the latch circuit 119 serves to hold data when the RAM 117 is used as an accumulator.

The operation of the second embodiment constructed as described above will be now explained.

(a) Case where RAM is used as FIFO (PUSH mode)

In a PUSH request mode, the PUSH request signal PUSH-req and data Din1 are supplied to the control system. In response to the PUSH request signal PUSH-req thus supplied, the conflict control circuit 116 generates control signals S1, S5, control signal (select signal) for the selecting circuit 115, and the write enable signal for the single-port RAM 117, in appropriate timing, and supplies these signals to respective portions of the system.

The latch circuit 110 holds the data Din1 according to the control signal S1 from the conflict control circuit 116. Then, the selecting circuit 112 selects the data Din1 held in the latch circuit 110, according to the control signal S5 from the conflict control circuit 116, and supplies the data Din1 to the data input terminal I of the RAM 117.

On the other hand, the counter 113 updates its count value when it receives the PUSH request signal PUSH-req. The selecting circuit 115 selects the updated count value of the counter 113 according to a control signal (select signal) from the conflict control circuit 116, and supplies the selected count value to the address input terminal A of the RAM 117.

The single-port RAM 117 uses the count value supplied to the address input terminal A to provide an address, and stores (pushes) the data Din1 supplied to the above data input terminal I in an address location corresponding to this address, at a time when the write enable signal is supplied from the conflict control circuit 116 to the RAM 117.

(b) Case where RAM is used as FIFO (POP mode)

In a POP request mode, the POP request signal POP-req is supplied to the control system. In response to the POP request signal POP-req, the conflict control circuit 116 generates the control signal S3, control signal (select signal) for the selecting circuit 115, and the write enable signal for the RAM 117, in certain timing, and supplies these signals to respective portions of the system.

The counter 114 updates its count value when it receives the POP request signal POP-req. The selecting circuit 115 selects the updated count value of the counter 114 according to the control signal (select signal) from the conflict control circuit 116, and supplies the selected count value to the address input terminal A of the RAM 117.

At a point of time when the write enable terminal WE is placed in the non-active state due to inversion of the write enable signal from the conflict control circuit 116, the RAM 17 reads and outputs data from the output terminal O, which data has been stored in an address location corresponding to an address provided by the count value supplied to the address input terminal A. The latch circuit 118 holds the data according to the control signal S3 from the conflict control circuit 116, and outputs the data denoted by Dout1 to a circuit in the later stage.

(c) Case where RAM is used as random access memory (writing mode)

Where data is written into the RAM 117 as a random access memory, the WRITE request signal W-req and a WRITE address W-add are supplied, and data Din2 is also supplied. In response to the WRITE request signal W-req, the conflict control circuit 116 generates control signals S2, S5, control signal (select signal) for the selecting circuit 115, and the write enable signal for the single-port RAM 117, in appropriate timing, and supplies these signals to respective portions of the system.

The latch circuit 111 holds the data Din2 according to the control signal S2 from the conflict control circuit 116. The selecting circuit 112 selects the data Din2 held in the latch circuit 111, according to the control signal S5 from the conflict control circuit 116, and supplies the selected data to the data input terminal I of the RAM 117.

On the other hand, the selecting circuit 115 selects the WRITE address W-add according to the control signal (select signal) from the conflict control circuit 116, and supplies the selected address to the address input terminal A of the RAM 117.

At a point of time when the write enable terminal WE is placed in the non-active state due to inversion of the write enable signal supplied from the conflict control circuit 116, the single-port RAM 17 stores the data Din2 supplied to the data input terminal I, in an address location corresponding to the WRITE address W-add supplied to the address input terminal A.

(d) Case where RAM is used as random access memory (reading mode)

When data is read out from the RAM 117 as a random access memory, the READ request signal R-req and READ address R-add are supplied to the control system. In response to the READ request signal R-req, the conflict control circuit 116 generates a control signal (S4), control signal (select signal) for the selecting circuit 115, and a write enable signal for the RAM 117, in appropriate timing, and supplies these signals to respective portions of the system.

The selecting circuit 115 selects the READ address R-add according to the control signal (select signal) from the conflict control circuit 116, and supplies the selected address to the address input terminal A of the RAM 117.

At a point of time when the write enable terminal WE is placed in the non-active state due to inversion of the write enable signal from the conflict control circuit 116, the single-port RAM 17 reads out and outputs data from the output terminal O, which data has been stored in an address location corresponding to the READ address R-add supplied to the address input terminal A. The latch circuit 119 holds the data according to the control signal S4 from the conflict resolution control circuit 116, and generates the data denoted by Dout2 to a circuit in the later stage.

(e) Case where RAM is used as accumulator

In the above description, the cases where the single-port RAM 117 is used as a FIFO and as a random access memory have been illustrated. Where the RAM 117 is used as an accumulator, data to be processed is read from the RAM 117 in response to the READ request signal R-req and READ address R-add, according to the read-out procedure as described above with respect to the case where the RAM 117 is used as a random access memory. Then, calculations are performed on the data thus read, and the result is written into the same address as the above-indicated READ address according to the writing procedures as described above with respect to the case where the RA<M 117 is used as a random access memory.

In the second embodiment, the RAM provided with a single port is used, and therefore the FIFO processing and the accumulator processing (or random access processing) can be accomplished at a reduced cost.

Figure 5:
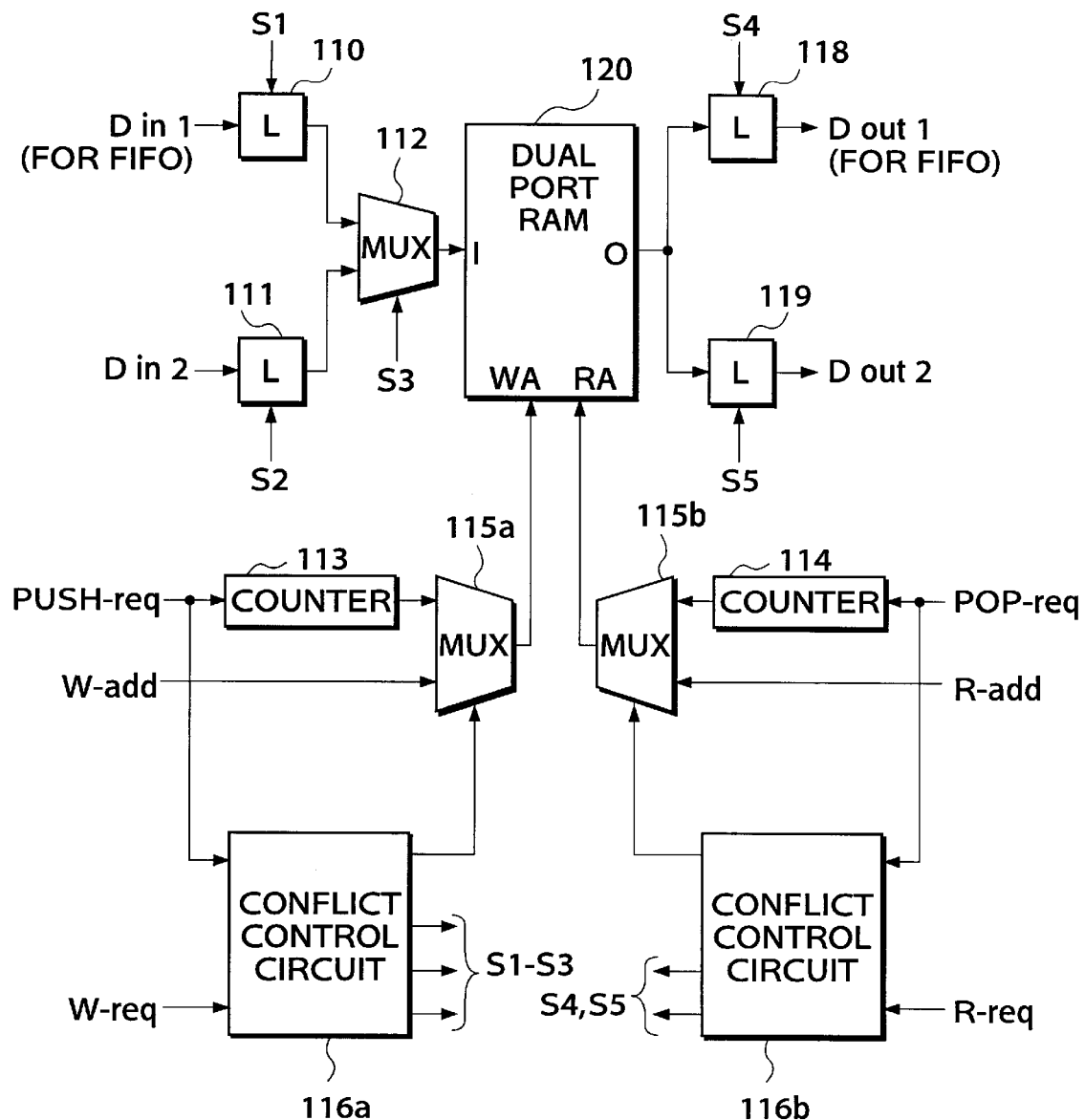
FIG. 5 is a block diagram showing the construction of a third embodiment of the invention.

In the second embodiment described above, the single-port RAM 17 is connected to two systems for writing and two systems for reading, and therefore a large burden is imposed on the RAM 17. To reduce the burden, a dual-port RAM is used in a third embodiment described below, wherein writing and reading operations are performed independently of each other. FIG. 5 shows the construction of the third embodiment of the invention. In FIG. 5, the same reference numerals as used in FIG. 3 and FIG. 4 are used for identifying corresponding elements. Since a dual-port RAM 120 is capable of performing writing and reading operations in parallel with each other, a system for PUSH and writing of data and a system for POP and reading of data are provided independently of each other.

A selecting circuit 115a corresponds to the selecting circuit 115 shown in FIG. 4, and serves to select one of a WRITE address W-add with which the dual-port RAM 120 is randomly accessed, and a count value that is updated in response to a PUSH request signal PUSH-req, according to a control signal from a conflict control circuit 116a, and supply the selected data (address or count value) to a WRITE address input terminal WA of the dual-port RAM 120. On the other hand, a selecting circuit 115b selects one of a READ address W-add with which the dual-port RAM 120 is randomly accessed, and a count value that is updated in response to a POP request signal POP req, according to a control signal from a conflict control circuit 116b, and supply the selected data (address or count value) to a READ address input terminal RA of the dual-port RAM 120.

The conflict control circuit 116a produces control signals (select signal, latch timing signal, and so forth) to be supplied to the latch circuits 110, 111 and selecting circuits 112, 115a, upon receipt or supply of a WRITE request signal W-req with which the RAM 120 is randomly accessed, or a PUSH request signal PUSH-req, and supplies these signals to respective portions of the system. On the other hand, the conflict control circuit 116b produces control signals (select signal, latch timing signal, and so forth) to be supplied to the selecting circuit 115b and the latch circuits 118, 119 which will be described later, upon receipt of a READ request signal R-req with which the RAM 120 is randomly accessed, or a POP request signal POP-req, and supplies these signals to respective portions of the system.

The operation of the third embodiment constructed as described above will be now described.

(a) Case where RAM is used as FIFO (PUSH mode)

In a PUSH request mode, the PUSH request signal PUSH-req is supplied to the control system, and data Din1 is also supplied to the system. In response to the PUSH request signal PUSH-req, the conflict resolution control circuit 116a generates control signals S1–S3, and a control signal (select signal) for the selecting circuit 115a, in appropriate timing, and supplies these signals to respective portions of the system.

The latch circuit 110 holds the data Din1 according to the control signal S1 from the conflict control circuit 116a. The selecting circuit 112 then selects the data Din1 held in the latch circuit 110, according to the control signal S3 from the conflict control circuit 116a, and supplies the data Din1 to the data input terminal I of the RAM 120.

On the other hand, the counter 113 updates its count value when it receives the PUSH request signal PUSH-req. The selecting circuit 115a selects the updated count value of the counter 113 according to the control signal (select signal) from the conflict control circuit 116a, and supplies the count value to a WRITE address input terminal WA of the RAM 120.

The dual-port RAM 120 uses the count value supplied to the WRITE address input terminal WA as an address, and stores (pushes) the data Din1 supplied to the above data input terminal I, in an address location that corresponds to this address.

(b) Case where RAM is used as FIFO (POP mode).

In a POP request mode, the POP request signal POP-req is supplied to the control system. In response to the POP request signal POP-req, the conflict control circuit 116b generates a control signal S4, and a control signal (select signal) for the selecting circuit 115b, in appropriate timing, and supplies these signals to respective portions of the system.

The counter 114 updates its count value when it receives the POP request signal POP-req. The selecting circuit 115b selects the updated count value of the counter 114 according to the control signal (select signal) from the conflict control circuit 116b, and supplies the count value to the address input terminal A of the RAM 120.

The RAM 120 reads and outputs data from its output terminal O, which data has been stored in an address location that corresponds to an address that is represented by the count value supplied to the READ address input terminal RA. The latch circuit 118 holds data output from the RAM 120, according to a control signal S4 from the conflict control circuit 116b, and outputs the data denoted by Dout1 to a circuit in the later stage.

(c) Case where RAM is used as random access memory (writing mode)

Where data is written into the RAM 120 that serves as a random access memory, the WRITE request signal W-req and WRITE address W-add are supplied, and data Din2 is also supplied. In response to the WRITE request signal W-req, the conflict control circuit 116a generates the control signals S2, S3 and control signal (select signal) for the selecting circuit 115a, in appropriate timing, and supplies these signals to respective portions of the system.

The latch circuit 111 holds the data Din2 according to the control signal S2 from the conflict control circuit 116a. The selecting circuit 112 then selects the data Din2 held in the latch circuit 111, according to the control signal S3 from the conflict control circuit 116a, and supplies the selected data to the data input terminal I of the RAM 120.

On the other hand, the selecting circuit 115a selects the WRITE address W-add according to the control signal (select signal) from the conflict control circuit 116a, and supplies the selected address to the WRITE address input terminal WA of the RAM 120.

The dual-port RAM 120 stores the data Din2 supplied to the data input terminal I, in an address location corresponding to the WRITE address W-add supplied to the WRITE address input terminal WA.

(d) Case where RAM is used as random access memory (reading mode)

When data is read out from the RAM 120 that serves as a random access memory, the READ request signal R-req and READ address R-add are supplied to the control system. In response to the READ request signal R-req, the conflict control circuit 116b generates a control signal S5, and a control signal (select signal) for the selecting circuit 115b, in appropriate timing, and supplies these signals to respective portions of the system.

The selecting circuit 115b selects the READ address R-add according to the control signal (select signal) from the conflict control circuit 116, and supplies the selected address to the READ address input terminal RA of the RAM 120.

The dual-port RAM 120 reads and outputs data from the output terminal O, which data has been stored in an address location corresponding to the READ address R-add supplied to the READ address input terminal RA. The latch circuit 119 holds the data according to the control signal S5 from the conflict control circuit 116b, and generates the data denoted by Dout2 to a circuit in the later stage.

(e) Case where RAM is used as accumulator

In the above description, the cases where the dual-port RAM 120 is used as a FIFO and as a random access memory have been illustrated, as in the second embodiment. Where the RAM 120 is used as an accumulator, data to be processed is read from the RAM 120 in response to the READ request signal R-req and READ address R-add, according to the read-out procedure as described above with respect to the case where the RAM 120 is used as a random access memory. Then, certain calculations are performed on the data thus read, and the result is written into the same address as the above-indicated READ address, according to the writing procedure as described above with respect to the case where the RAM 120 is used as a random access memory. Assuming that a series of operations, namely, reading, calculating, and writing of data, can be performed in one operating cycle or period, the accumulating operation can be performed by using the same address as the READ address R-add and WRITE address W-add. If the series of the above operations cannot be completed in one operating cycle or period, the data may be held in a register for calculation, and written into the memory in the next operating cycle.

In the third embodiment described above, the dual-port type RAM is used, such that the writing system and reading system are provided separately and operate independently of each other, whereby the possibility of occurrence of conflict between signals can be advantageously reduced, thus permitting the RAM to operate with high reliability.

Figure 6:
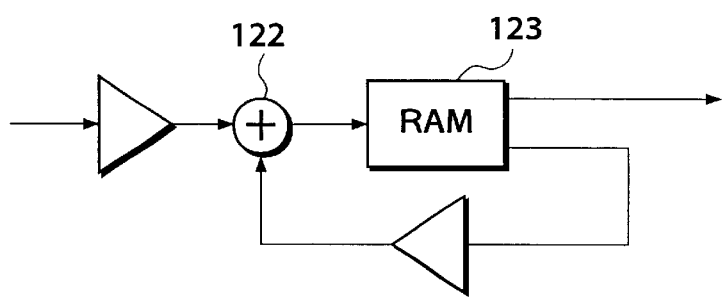
FIG. 6 is a block diagram showing the basic construction of a fourth embodiment of the invention using a RAM as an accumulator FIFO.

FIG. 6 shows the basic construction of a fourth embodiment of the invention. While data that are accessed in a FIFO (first-in first-out) method and data that are randomly accessed (or accumulated) have no relation with each other in the second and third embodiments described above, the control apparatus of the fourth embodiment is used in an application where data to be accessed in a FIFO method and data to be accumulated are closely related to each other.

In FIG. 6, an adder 122 adds input data and data read from a RAM 123, after these data are multiplied by respective predetermined coefficients, and writes data as a result of the addition into the RAM 123. Namely, upon receipt of a WRITE request (PUSH request), data located at a designated address is once read from the RAM 123, and a certain operation is performed on the read data in association with input data that is currently supplied. The resulting data is then written into the same address of the RAM 123. Upon receipt of a READ request (POP request), on the other hand, data located at a designated address is read from the RAM 123, and generated. In the following description, the processing (function) in which accumulation is concurrently performed in association with a PUSH action of FIFO as described above will be called accumulator FIFO processing (function).

Figure 7:
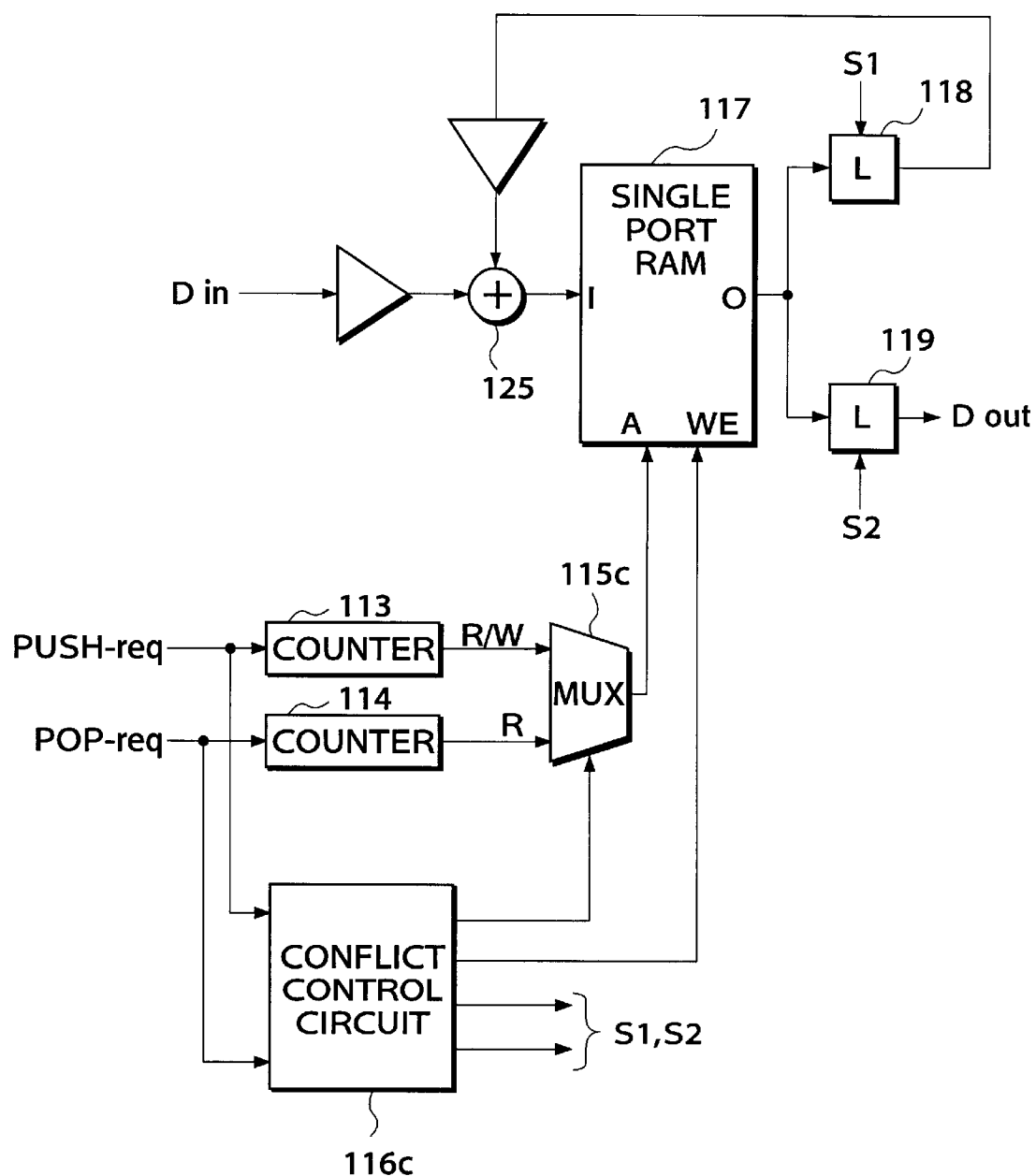
FIG. 7 is a block diagram showing a specific arrangement of a fourth embodiment of the invention.

FIG. 7 shows a specific construction of the fourth embodiment. In FIG. 7, the same reference numerals as used in FIGS. 3–5 are used to identify corresponding elements. In FIG. 7, a single-port RAM 117 is used as RAM, and a selecting circuit 115c is provided for selecting one of a count value that is updated in response to a PUSH request signal PUSH-req that is supplied when the RAM 117 is used as an accumulator FIFO, and a count value that is updated in response to a POP request signal POP-req, according to a control signal from a conflict control circuit 116c, and supplies the selected count value to an address input terminal A of the RAM 117.

The conflict control circuit 116c produces control signals (select signal, latch timing signal, write enable signal, and so forth) to be supplied to the selecting circuit 115c, RAM 117, and latch circuits 118, 119, upon receipt of the above-indicated PUSH request signal PUSH-req or POP request signal POP-req, and supplies these signals to respective portions of the system. The latch circuit 118 holds data generated from the RAM 117, according to the control signal S1, and supplies the data to an adder 125. The adder 125 adds data Din supplied to one of its input terminals and the above data supplied from the latch circuit 118 to the other input terminal, after weighting (or multiplying) the respective data by appropriate coefficients, and supplies the result of the addition to the data input terminal I of the RAM 117. The latch circuit 119 holds data generated from the RAM 117, according to the control signal S2 from the conflict control circuit 116c, and outputs the data now denoted by Dout to a circuit in the later stage.

The operation of the fourth embodiment constructed as described above will be now described.

(a) Case where RAM is used as accumulator FIFO (PUSH mode)

When the PUSH request signal PUSH-req, along with data Din, is supplied to the control system, the conflict control circuit 116c generates a control signal (select signal) for the selecting circuit 115c, and a write enable signal WE for the RAM 117, in appropriate timing, in response to the PUSH request signal PUSH-req, and supplies these signals to the respective portions. More specifically, at a first point of time, the selecting circuit 115c selects the count value of the counter 113 and the write enable terminal WE of the RAM 117 is set or placed in a non-active state, so that data located at an address corresponding to the count value of the counter 113 is read from the RAM 117, and latched in the latch circuit 118. At a subsequent second point of time, the write enable terminal WE is placed in the active state, so that the result of calculations performed on the data read out at the first point of time and current input data Din, i.e., the output of the adder 125, is written into the RAM 117 at the same address as the READ address from which the above data was read.

(b) Case where RAM is used as accumulator FIFO (POP mode)

In a POP request mode, the POP request signal POP-req is supplied. In response to the POP request signal POP-req, the conflict control circuit 116c generates a control signal S2, control signal (select signal) for the selecting circuit 115c, and write enable signal for the RAM 117, in appropriate timing, and supplies these signals to respective portions of the system.

The counter 114 updates its count value when receiving the POP request signal POP-req. The selecting circuit 115c then selects the updated count value of the counter 114 according to the control signal (select signal) from the conflict control circuit 116c, and supplies the selected count value to the address input terminal A of the RAM 117.

The single-port RAM 117 reads and outputs data from its output terminal O, which data has been stored at an address corresponding to the count value supplied to the address input terminal A. The latch circuit 119 holds the data generated from the RAM 117, according to a control signal S2 from the conflict control circuit 116c, and outputs the data now denoted by Dout to a circuit in the later stage.

To perform normal FIFO processing that does not involve accumulation, using the construction of the fourth embodiment, the coefficient by which the input data Din is multiplied is set to "1", and respective portions of the control system are appropriately controlled by the conflict control circuit 116c. The control apparatus of the fourth embodiment may employ a dual-port RAM as used in the third embodiment (as in the arrangement of FIG. 5), instead of the single-port RAM 117 indicated above.

Figure 8:
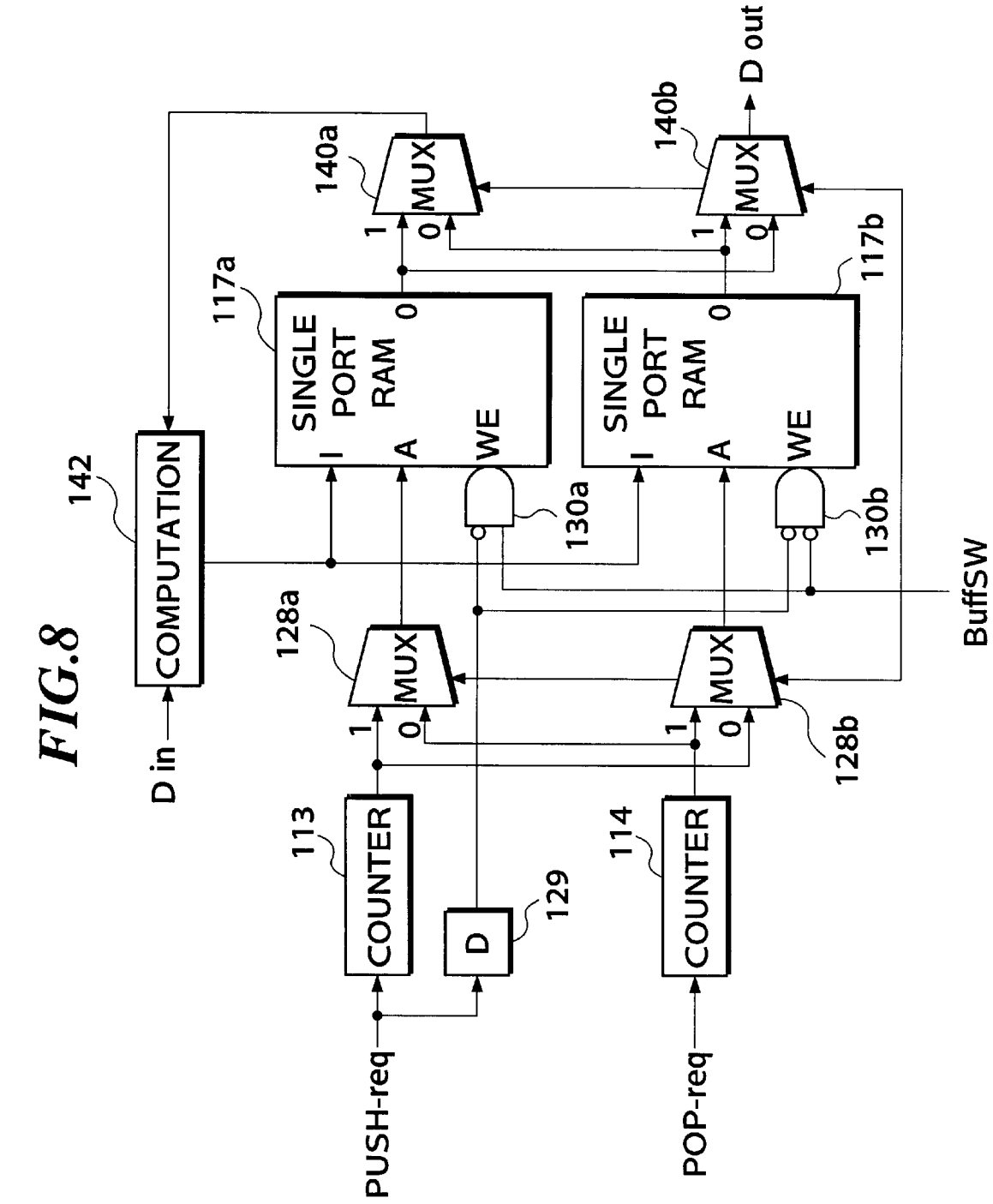
FIG. 8 is a block diagram showing the construction of a fifth embodiment of the invention.

FIG. 8 shows the construction of a fifth embodiment of the invention. In the fifth embodiment, the same processing (accumulator FIFO processing) as performed in the fourth embodiment is accomplished, using two single-port RAMs in a double-buffer arrangement. In FIG. 8, the same reference numerals as used in FIGS. 3–7 are used to identify corresponding elements, of which description is omitted. In FIG. 8, a selecting circuit 128a selects one of a count value of the counter 113 and a count value of the counter 114, according to a buffer switch signal BuffSW, and supplies the selected count value to an address input terminal A of a single port RAM 117a. More specifically, the selecting circuit 128a supplies the count value of the counter 113 to the RAM 117a when the buffer switch signal BuffSW is "1", and supplies the count value of the counter 114 to the RAM 117a when the buffer switch BuffSW is "0".

A selecting circuit 128b selects one of a count value of the counter 113 and a count value of the counter 114, according to the buffer switch signal BuffSW, and supplies the selected count value to an address input terminal A of a single port RAM 117b. More specifically, the selecting circuit 128b supplies the count value of the counter 113 to the RAM 117b when the buffer switch signal BuffSW is "1", and supplies the count value of the counter 114 to the RAM 117b when the buffer switch BuffSW is "0".

A delay circuit 129 delays a PUSH request signal PUSH-req, and supplies the delayed signal to one of input terminals of an AND circuit 130a and one of input terminals of an AND circuit 130b. When the buffer switch signal BuffSW is "1" with the delayed PUSH request signal PUSH-req being "0", the AND circuit 130a places the write enable terminal WE of the RAM 117a in an active state. When the buffer switch signal BuffSW is "0" with the delayed PUSH request signal PUSH-req being "0", the AND circuit 130b places the write enable terminal WE of the RAM 117b in an active state.

In the RAM 117a, when the write enable terminal WE of the RAM 117a is placed in the active state, data supplied to the data input terminal I is stored in an address location that corresponds to the count value (of the counter 113 or counter 114) supplied to the address input terminal A. When the write enable terminal WE of the RAM 117a is placed in the non-active state, data stored in an address location that corresponds to the count value (of the counter 113 or counter 114) supplied to the address input terminal A is read out and generated from the data output terminal O of the RAM 117a. In the RAM 117b, on the other hand, when the write enable terminal WE is placed in the active state, data supplied to the data input terminal I is stored in an address location that corresponds to the count value (of the counter 113 or counter 114) supplied to the address input terminal A. When the write enable terminal WE of the RAM 117b is placed in the non-active state, data stored in an address location that corresponds to the count value (of the counter 113 or counter 114) supplied to the address input terminal A is read out and generated from the data output terminal O of the RAM 117b.

A selecting circuit 140a selects one of output data of the RAM 117a and output data of the RAM 117b, according to the buffer switch signal BuffSW, and supplies the selected data to a computing unit 142. More specifically, the selecting circuit 140a supplies the output data of the RAM 117a to the computing unit 142 when the buffer switch BuffSW is "1", and supplies the output data of the RAM 117b to the computing unit 142 when the buffer switch signal BuffSW is "0". A selecting circuit 140b selects one of output data of the RAM 117b and output data of the RAM 117a, according to the buffer switch signal BuffSW, and outputs the selected data as data Dout. More specifically, the selecting circuit 140b outputs the output data of the RAM 117b as data Dout when the buffer switch signal BuffSW is "1", and outputs the output data of the RAM 117a as data Dout when the buffer switch signal BuffSW is "0".

Figure 9:
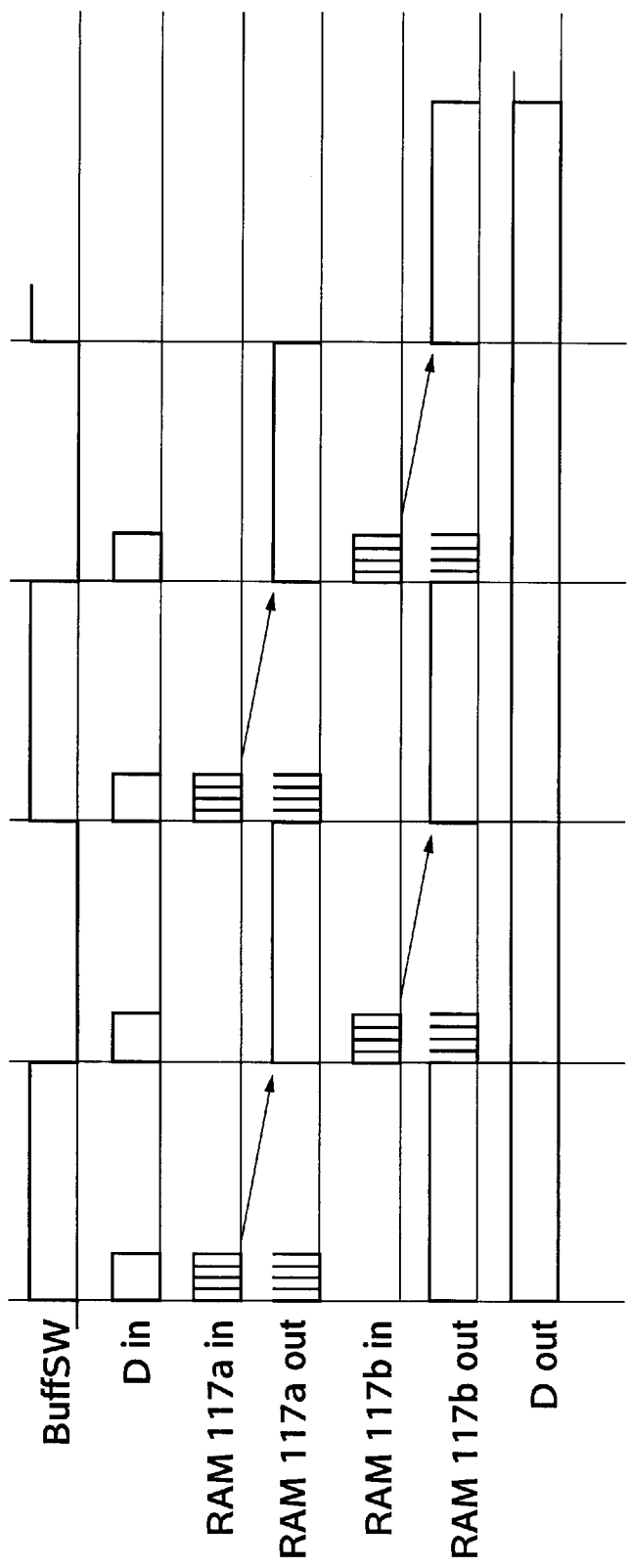
FIG. 9 is a timing chart useful in explaining the operation of the fifth embodiment.

The operation of the fifth embodiment described above will be now described. FIG. 9 is a timing chart useful in explaining the operation of the fifth embodiment. A PUSH or POP action is selectively performed on the RAM 117a or RAM 117b by switching the buffer switch signal BuffSW. When the buffer switch signal BuffSW is "1", PUSH (data writing) is performed on the RAM 117a so as to write data into the RAM 117a, while POP (data reading) is performed on the RAM 117b so as to read data from the RAM 117b. When the buffer switch signal BuffSW is "0", on the other hand, POP (data reading) is performed on the RAM 117a so as to read data from the RAM 117a, while PUSH (Data writing) is performed in the RAM 117b so as to write data into the RAM 117b.

In the case where the RAMS 117a, 117b are operated as accumulator FIFO, if the PUSH request signal PUSH-req is supplied, data located at an address indicated by the count value of the counter 113 or counter 114 is read from the RAM 117a or RAM 117b, depending upon the level of the buffer switch signal BuffSW and the level of the delayed PUSH request signal PUSH-req, and the read data is supplied to the computing unit 142 via the selecting circuit 140a. The computing unit 142 performs calculations on the data read from the RAM 117a or RAM 117b and input data Din. The data as a result of the calculation is stored inn the same address as the address of the RAM 117a or RAM 117b from which the above data was read, depending upon the level of the buffer switch signal BuffSW and the level of the delayed PUSH request signal PUSH-req.

In the fifth embodiment described above, reliable accumulator FIFO operations can be accomplished, while avoiding conflict between PUSH and POP.

Figure 1:
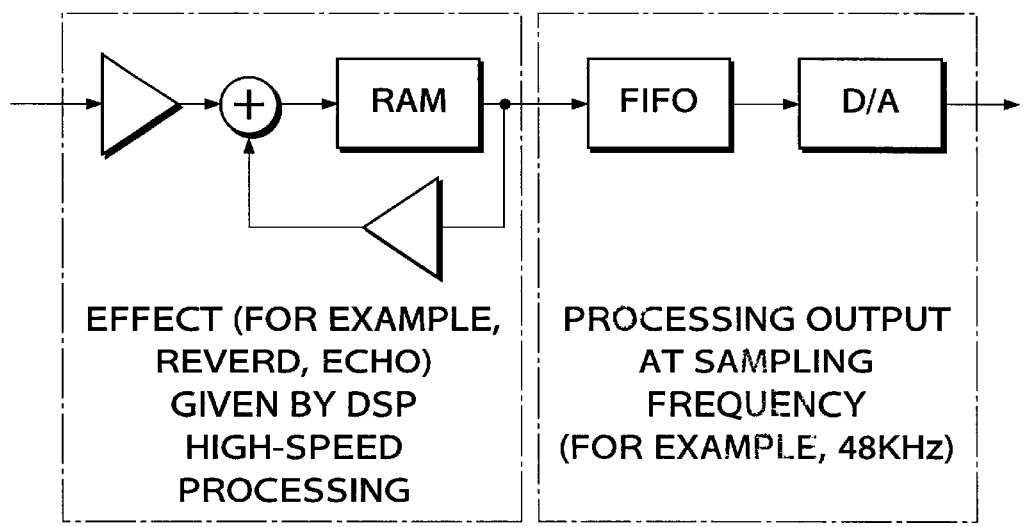
FIG. 1 is a block diagram showing the construction of a known sound signal processing apparatus including an accumulator and a FIFO.
Figure 2:
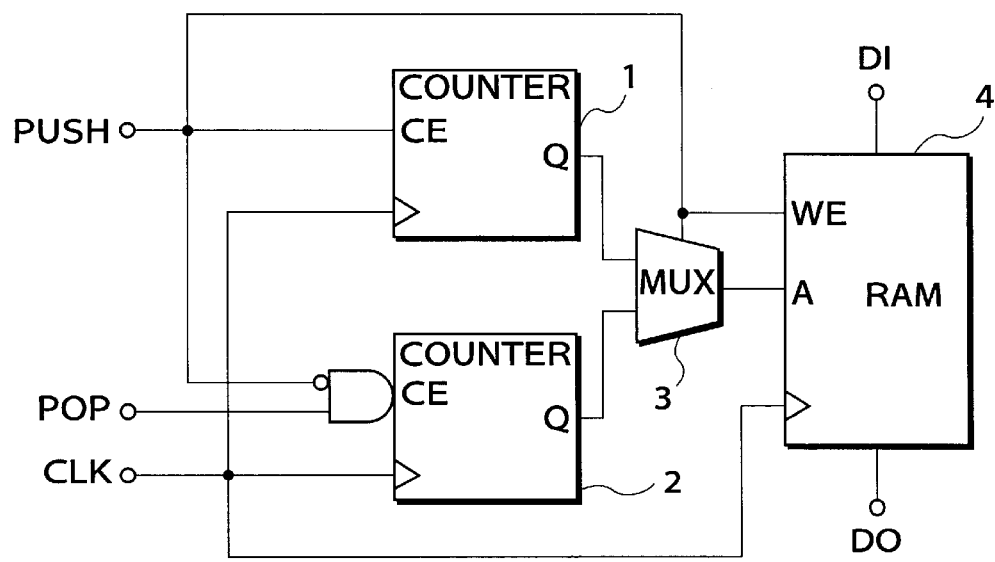
FIG. 2 is a block diagram showing the construction of a known FIFO that is constructed by using a single-port RAM.
Figure 10:
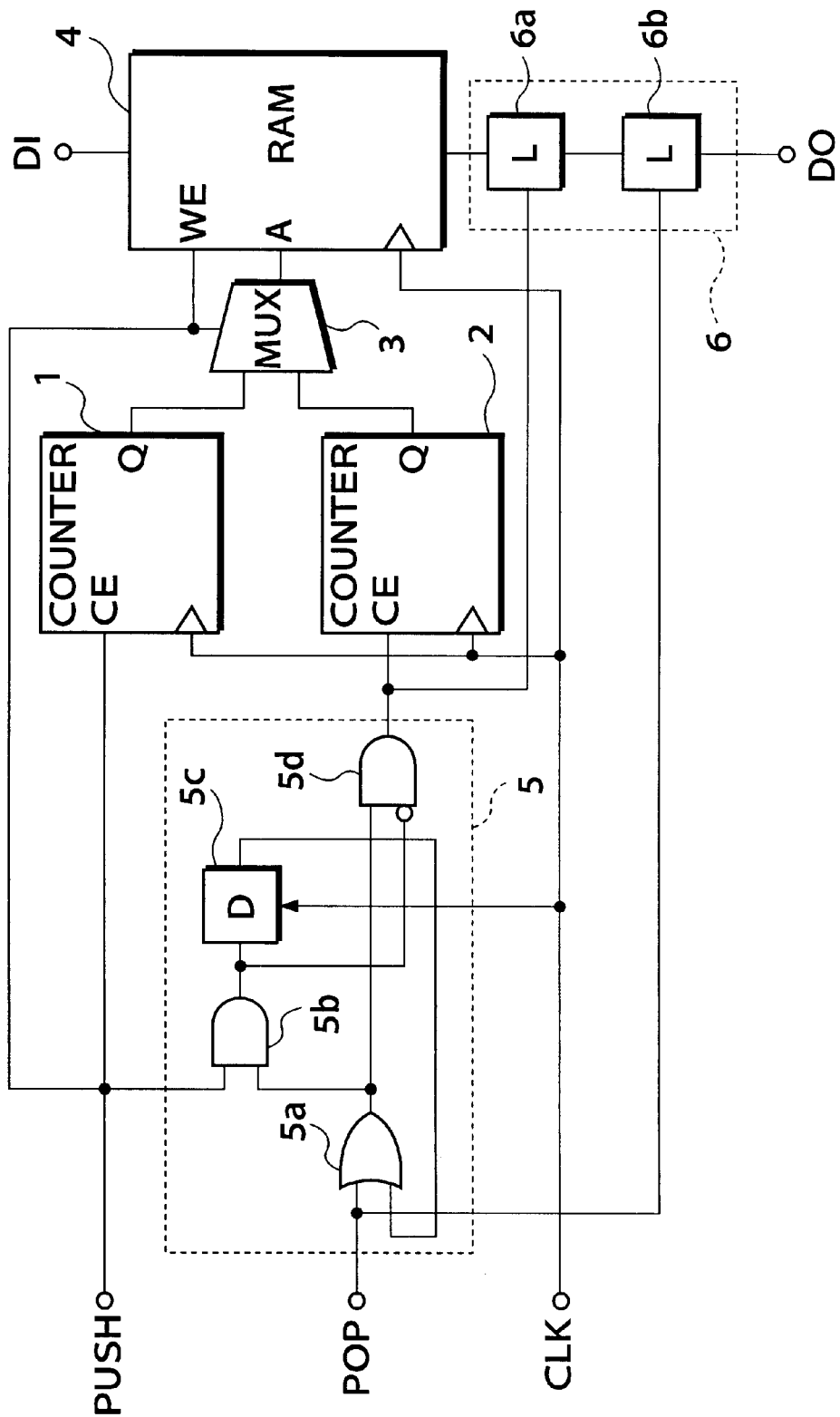
FIG. 10 is a block diagram showing the configuration of a digital control circuit according to a sixth embodiment of the invention, which controls a FIFO and writing and reading of data with respect to the FIFO.

FIG. 10 shows the construction of a sixth embodiment of the invention, which controls a FIFO or pushup storage using a single-port RAM, and writing and reading of data with respect to the FIFO. In FIG. 10, the same reference numerals as used in FIG. 2 are used for identifying corresponding elements, of which description is omitted. In FIG. 10, a control circuit 5 is mainly formed of an OR circuit 5a, an AND circuit 5b, a delay circuit 5c, and an AND circuit 5d. A POP signal is input to one of input terminals of the OR circuit 5a, and the output of the delay circuit 5c as described later is input to the other input terminal, so that the OR circuit 5a carries out the logical OR between these signals. The result of the OR operation is then supplied to one of input terminals of the AND circuit 5b and one of input terminals of the AND circuit 5d.

The AND circuit 5b receives a PUSH signal and the output of the OR circuit 5a as described above, and carries out the logical AND between the PUSH signal and the output. The result of the AND operation is then supplied to the other input terminals of the delay circuit 5c and AND circuit 5d. The delay circuit 5c delays the output of the AND circuit 5b by one clock pulse, and supplies the delayed output signal to the other input terminal of the OR circuit 5a. The AND circuit 5d carries out the logical AND between the output of the OR circuit 5a and an inverted value of the output of the AND circuit 5b, and supplies the result to a chip select terminal CE of a POP counter 2.

A holding circuit 6, which is formed of latch circuits 6a, 6b, is provided for generating new data in synchronism with occurrence of the POP signal. In the present embodiment, when the PUSH signal and the POP signal conflict with each other, namely, when the PUSH signal and the POP signal occur at the same time, the PUSH action is carried out first, during which the POP action is suspended, as described later, whereby the POP action may be performed at a time different from desired POP timing. In the present embodiment, the latch circuits 6a, 6b indicated above are provided for matching the POP action with the desired POP timing.

Figure 11:
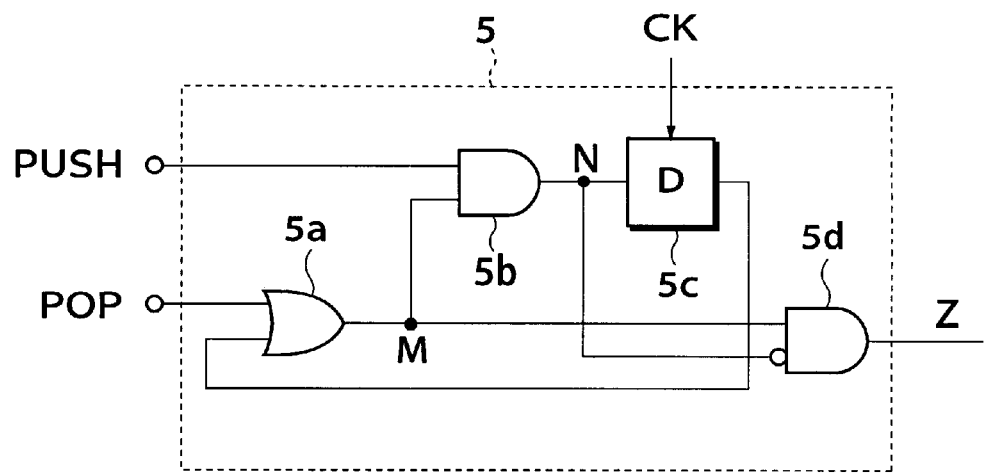
FIG. 11 is a circuit diagram useful in explaining the operation of the digital control circuit of FIG. 10.
Figure 12:
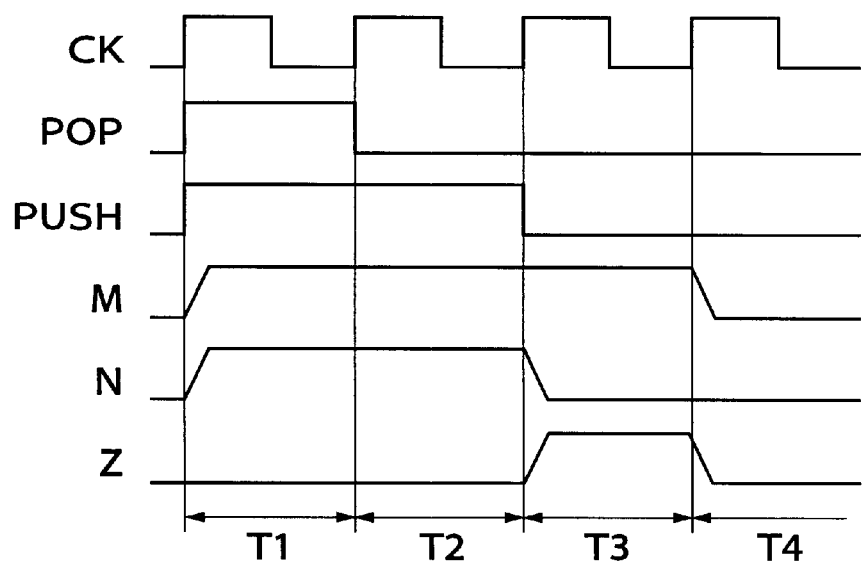
FIG. 12 is a timing chart useful in explaining the digital control circuit of FIG. 10.

The operation of the sixth embodiment constructed as described above will be now described. FIG. 11 is a circuit diagram useful in explaining the operation of the control circuit 5. FIG. 12 is a timing chart useful in explaining the operation. When the PUSH signal and the POP signal are generated at the same time T1, the output M of the OR circuit 5a becomes equal to "1". As a result, both of the input terminals of the AND circuit 5b receive "1", and the output N of the AND circuit 5b becomes equal to "1". The AND circuit 5b carries out the logical AND between the output M (="1") of the OR circuit 5a and the inverted value (="0") of the output N of the AND circuit 5b, and therefore the output Z of the circuit 5b remains "0". Accordingly, the POP counter 2 is not updated, and data is not read from the RAM 4, while data is written into the RAM 4 based on the PUSH signal generated simultaneously with the POP signal, and the PUSH counter 1 is updated.

Although the POP signal becomes equal to "0" in the next cycle T2, the output N of the AND circuit 5b is delayed by the delay circuit 5c and supplied to the OR circuit 5a, and therefore the output M of the OR circuit 5a remains "1" in the cycle T2. Since the PUSH signal is "1" and the output M of the OR circuit 5a is "1" in the AND circuit 5b, the output N of the circuit 5b remains "1". Accordingly, the output Z of the AND circuit 5d remains "0". Namely, the PUSH signal is continuously supplied over a period from the beginning of T1 to the end of T2, and thus the POP action which has been suspended is suspended for an additional time.

The PUSH signal becomes equal to "0" in the next cycle T3. At this time, the OR circuit 5a receives the output N of the AND circuit 5b in the cycle T2 that is delayed by the delay circuit 5c, and therefore the output M of the circuit 5a remains "1". Since the PUSH signal becomes equal to "0:, the output N of the AND circuit 5b becomes equal to "0". As a result, the output Z of the AND circuit 5d becomes equal to "1". Namely, the POP action that has been suspended is carried out in the cycle T3.

In the next cycle T4, the output N of the AND circuit 5b has been "0" since the previous cycle T3, and therefore the output Z of the AND circuit 5d becomes equal to "0".

In the control circuit 5 described above, when the PUSH signal and POP signal are generated simultaneously, a signal corresponding to the POP signal is supplied to the chip selector CE of the POP counter 2 after the PUSH signal stops being supplied. Thus, priority is automatically given to the PUSH signal, namely, the PUSH signal is carried out first even if the PUSH signal and POP signal are generated at the same time, and subsequently, the POP signal is carried out or made effective. If the POP signal is represented by "non-prioritized signal A", and the PUSH signal is represented by "prioritized signal B", the output Z may be called "non-prioritized signal A" which is controlled to be generated after the prioritized signal B is finished. The prioritized signal B may be replaced by a busy signal or a wait signal.

Figure 13:
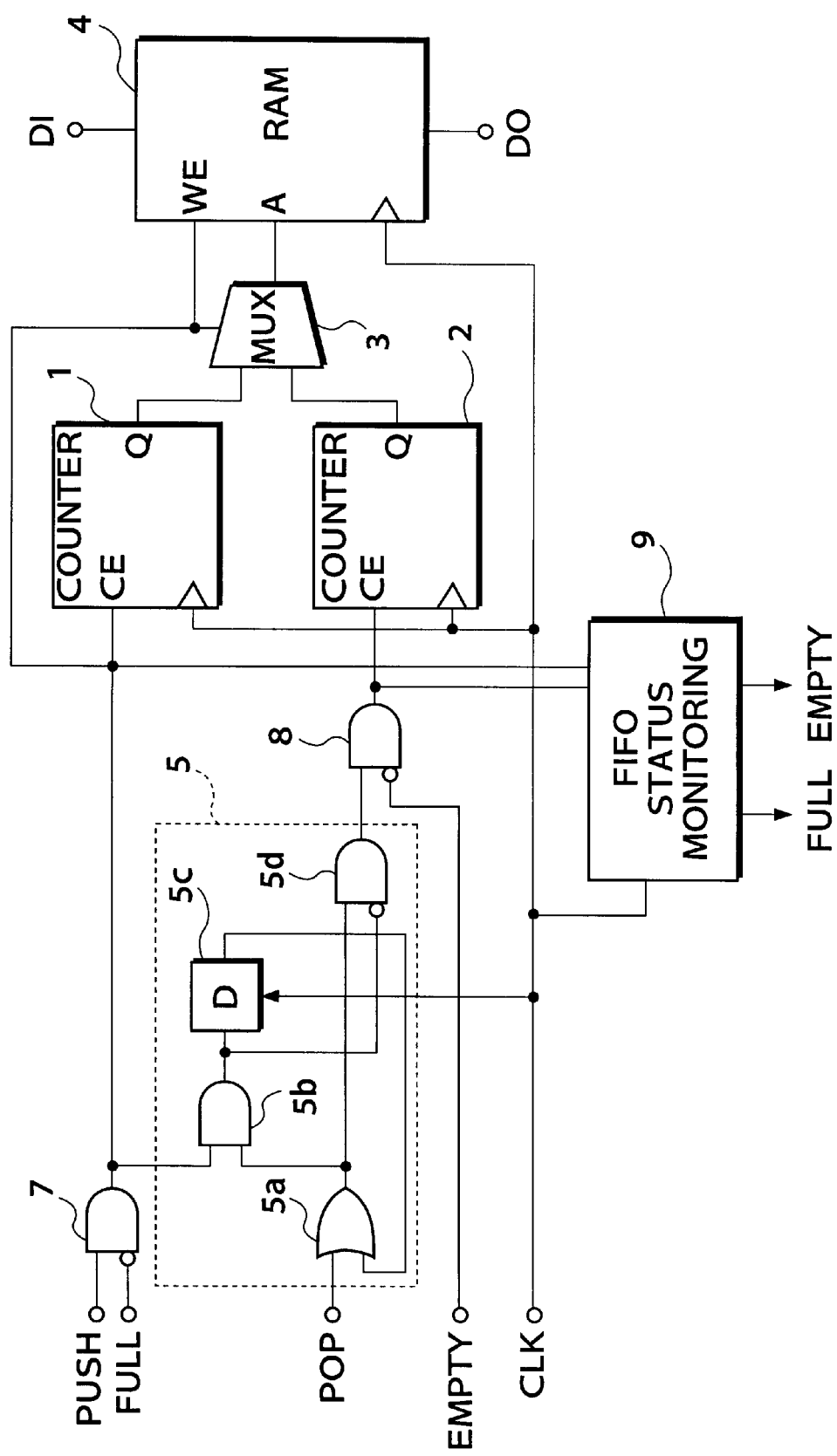
FIG. 13 is a block diagram showing the configuration of a digital control circuit according to a seventh embodiment of the invention, which controls a FIFO and writing and reading of data with respect to the FIFO.

FIG. 13 shows the construction of a seventh embodiment of the invention, which controls a FIFO using a single-port RAM, and writing and reading of data with respect to the FIFO. In FIG. 13, the same reference numerals as used in FIG. 10 are used for identifying corresponding elements, of which description is omitted.

In the sixth embodiment described above, when the PUSH signal and the POP signal are simultaneously generated, the PUSH signal is automatically carried out first with the POP signal being suspended, namely, the PUSH signal takes precedence over the POP signal. This arrangement tends to cause the RAM 4 to be full of data. In the seventh embodiment, priority is not automatically given to the PUSH signal, but the order of carrying out the PUSH signal and the POP signal is determined in view of the FIFO status (FULL or EMPTY) of the RAM 4. "FULL" indicates the state in which the RAM 4 is full of data, and no data can be further written into the RAM 4. The "FULL" state may include the case where the RAM 4 is almost full of data. "EMPTY" indicates the state in which the RAM 4 is empty, in other words, no data is stored in the RAM 4.

In FIG. 13, an AND circuit 7 carries out the logical AND between the PUSH signal and the inverted signal of a FULL signal which indicates that the RAM 4 is in a FULL state when set to "1", and supplies the result of the logical operation to the AND circuit 5b of the control circuit 5, and the chip select terminal CE of the PUSH counter 1. In this arrangement, if the FULL signal becomes equal to "1", the PUSH signal becomes ineffective or null. An AND circuit 8 carries out the logical AND between the POP signal as the output of the control circuit 5, and the inverted signal of an EMPTY signal which indicates that the RAM 4 is in an EMPTY state when set to "1", and supplies the result of the logical operation to the chip select counter CE of the POP counter 2. If the EMPTY signal becomes equal to "1", the POP signal as the output of the control circuit 5 becomes ineffective or null. A FIFO state monitoring block 9 monitors the output of the AND circuit 7 and the output of the AND circuit 8, and generates the FULL signal or the EMPTY signal.

The operation of the seventh embodiment constructed as described above will be now explained. When the PUSH signal and the POP signal are simultaneously generated while the RAM 4 is in a normal state (when both the FULL signal and EMPTY signal are equal to "0"), the PUSH signal is carried out first, and the POP signal becomes effective after supply of the PUSH signal is finished, as in the sixth embodiment.

Where the PUSH signal and POP signal are simultaneously generated while the RAM 4 is in the FULL state, on the other hand, the AND circuit 7 makes the PUSH signal ineffective or null, and therefore the POP action is not suspended, as distinct from the sixth embodiment. In other words, the FULL state means that no more data can be stored in the RAM 4, and thus only the POP signal for reading out data is made effective, and the PUSH signal for writing data is made ineffective or null.

Where the PUSH signal and POP signal are simultaneously generated or only the POP signal is generated while the RAM 4 is in the EMPTY state, the POP signal generated from the control circuit 5 is made ineffective by the AND circuit 8, and only the PUSH signal becomes effective. In other words, the EMPTY state means that no data to be read exists in the RAM 4, and thus only the PUSH signal for writing data is made effective, and the POP signal for reading out data is made ineffective or null.

In the seventh embodiment described above, when the PUSH signal and the POP signal are simultaneously generated while the RAM 4 is in a normal state, the POP signal becomes effective after the PUSH signal is finished. When the RAM 4 is in the FULL state, however, the PUSH signal does not become effective even if the PUSH signal and the POP signal are generated at the same time. Thus, the implementation of the PUSH signal and the POP signal can be limited depending upon the FIFO status (FULL or EMPTY) of the RAM 4, and the possibility or frequency of suspension of the POP signal can be reduced.

In the seventh embodiment described above, priority may be given to the POP signal, namely, the POP signal is carried out first, as a general rule, and the PUSH signal may be made effective when the RAM 4 is in the EMPTY state.

What is claimed is:

1. A control apparatus for controlling writing and reading of data with respect to a memory which is randomly accessible, comprising:

a write address producing device which produces a write address by a method according to a predetermined rule, in response to a write request to write data into the memory by the method according to the predetermined rule; and a write address switching device which selects one of a write address with which data is randomly written into the memory and the write address produced by said write address producing device;

a write control device which supplies a first switching signal to said write address switching device, to cause the write address switching device to select one of the write address with which the data is randomly written into the memory and the write address produced by said write address producing device, depending upon the presence of a request to write data into the memory by the method according to the predetermined rule, and the presence of a request to randomly write data into the memory;

a read address producing device which produces a read address by the method according to the predetermined rule, in response to a read request to read data from the memory by the method according to the predetermined rule;

a read address switching device which selects one of a read address with which data is randomly read from the memory and the read address produced by said read address producing device; and a read control device which supplies a second switching signal to said read address switching device, to cause the read address switching device to select one of the read address with which data is randomly read from the memory and the read address produced by said read address producing device, depending upon the presence of a request to read data from the memory by the method according to the predetermined rule, and the presence of a request to randomly read data from the memory, wherein data is written into the memory at a location that corresponds to the write address selected by said write address switching device and supplied to the memory, and data is read from the memory at a location that corresponds to the read address selected by said read address switching device and supplied to the memory.

2. A control apparatus according to claim 1, wherein said predetermined rule is a first-in first-out method.

3. A control apparatus for controlling writing and reading of data with respect to a memory which is randomly accessible, comprising:

a write address producing device which produces a write address by a method according to a predetermined rule, in response to a write request to write data into the memory;

a read address producing device which produces a read address by the method according to the predetermined rule, in response to a read request to read data from the memory;

an address switching device which selects one of the write address produced by said write address producing device, and the read address produced by said read address producing device, according to a given switching signal; and a computing device which adds data generated from the memory to data input to the control apparatus, wherein when the write request is generated, said write address producing device produces the write address in response to the write request, and data is read from an address location of the memory that corresponds to the write address, while said computing device adds the data read from the memory to the data input to the control apparatus, and then writes data obtained as a result of addition by the computing device into an address location of the memory that corresponds to said write address.

4. A control apparatus according to claim 3, wherein said predetermined rule is a first-in first-out method.

* * * * *